United States Patent
Ravot et al.

(10) Patent No.: US 8,063,645 B2
(45) Date of Patent: Nov. 22, 2011

(54) METHOD AND DEVICE FOR ANALYZING ELECTRIC CABLE NETWORKS

(75) Inventors: Nicolas Ravot, Chelles (FR); Josy Cohen, Le Plessis Trevise (FR); Pascal Chambaud, Igny (FR)

(73) Assignee: Commissariat a l'Energie Atomique (FR)

( * ) Notice: Subject to any disclaimer, the term of this patent is extended or adjusted under 35 U.S.C. 154(b) by 441 days.

(21) Appl. No.: 12/307,761

(22) PCT Filed: Jul. 5, 2007

(86) PCT No.: PCT/EP2007/056834

§ 371 (c)(1),
(2), (4) Date: Mar. 3, 2009

(87) PCT Pub. No.: WO2008/009566

PCT Pub. Date: Jan. 24, 2008

(65) Prior Publication Data

US 2010/0141264 A1 Jun. 10, 2010

(30) Foreign Application Priority Data

Jul. 18, 2006 (FR) ..................................... 06 06531

(51) Int. Cl.
*G01R 31/02* (2006.01)

(52) U.S. Cl. ....................................... 324/539; 324/533

(58) Field of Classification Search .................. 324/539, 324/538, 527, 532–534

See application file for complete search history.

(56) References Cited

U.S. PATENT DOCUMENTS

| | | | |
|---|---|---|---|
| 4,565,964 A * | 1/1986 | Matthews et al. | 324/539 |
| 5,369,366 A | 11/1994 | Piesinger | |
| 2005/0083067 A1 * | 4/2005 | Kirbas | 324/539 |
| 2006/0181283 A1 * | 8/2006 | Wajcer et al. | 324/539 |

FOREIGN PATENT DOCUMENTS

| | | |
|---|---|---|
| JP | 06118118 | 4/1994 |
| WO | WO02/068968 | 9/2002 |

(Continued)

OTHER PUBLICATIONS

Cynthia Furse et al., "Spread Spectrum Sensors for Critical Fault Location on Live Wire Networks", Journal of Structural Control and Health Monitoring, vol. 12, Issue 3-4, 2005.

(Continued)

*Primary Examiner* — Vincent Q Nguyen
(74) *Attorney, Agent, or Firm* — Lowe Hauptman Ham & Berner, LLP

(57) ABSTRACT

The invention relates to a method and a device for analyzing electric cables in a network, for the detection and location of defects in networks comprising at least one junction from which there depart N secondary cable stretches. The method includes interposing in the network, in series at the input of each the secondary stretches (T2, T3) starting from the junction (A), a respective bidirectional passive filter (FR2,FR3) able to cut off a frequency band associated with this stretch. The filters all allow through the useful frequencies for the normal operation of the network. A pulsed test is applied to the input of the network signal modulated by N different carrier frequencies each situated in one of the N frequency bands of the filters. The temporal position of test signal spikes reflected for each of the N frequencies is detected, and deducing therefrom the position of possible defects on a stretch of cable of the network.

17 Claims, 7 Drawing Sheets

FOREIGN PATENT DOCUMENTS

| WO | WO2004005947 | 1/2004 |
|---|---|---|
| WO | WO2004084033 | 9/2004 |

OTHER PUBLICATIONS

Chet Lo and Cynthia Furse, "Noise-Domain Reflectometry for Locating Wiring Faults", IEEE Transactions on Electromagnetic Compatability, vol. 47 No. 1, Feb. 2005.

Cynthia Furse et al., "Spread Spectrum Sensors for Critical Fault Location on Live Wire Networks", Journal of Structural Control and Health Monitoring, vol. 12, Issue 3-4, 2005.

Chet Lo and Cynthia Furse, "Noise-Domain Reflectometry for Locating Wiring Faults", IEEE Transactions on Electromagnetic Compatabilify, vol. 47 No. 1, Feb. 2005.

Kazutoki, Takeda et al. "A New Pulse Echo Fault Location Method Using Waveform Pattern Matching for Paired Subscriber Cables," Electronics & Communications in Japan, Part I—Communications, Wiley, Hoboken, NJ, US, vol. 75, No. 1, Jan. 1992, pp. 46-55, XP000307111, ISSN: 8756-6621.

\* cited by examiner

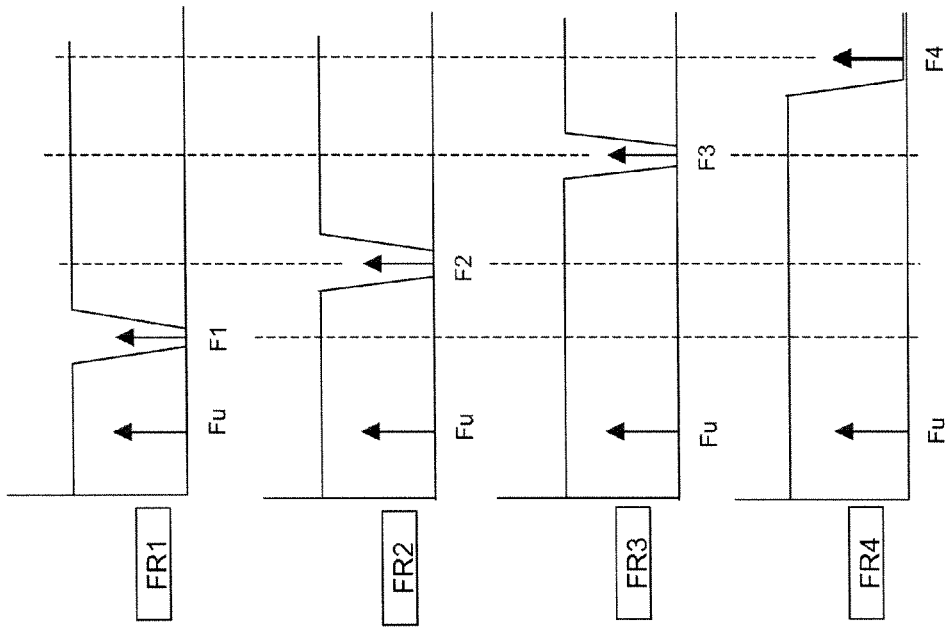
FIG. 10
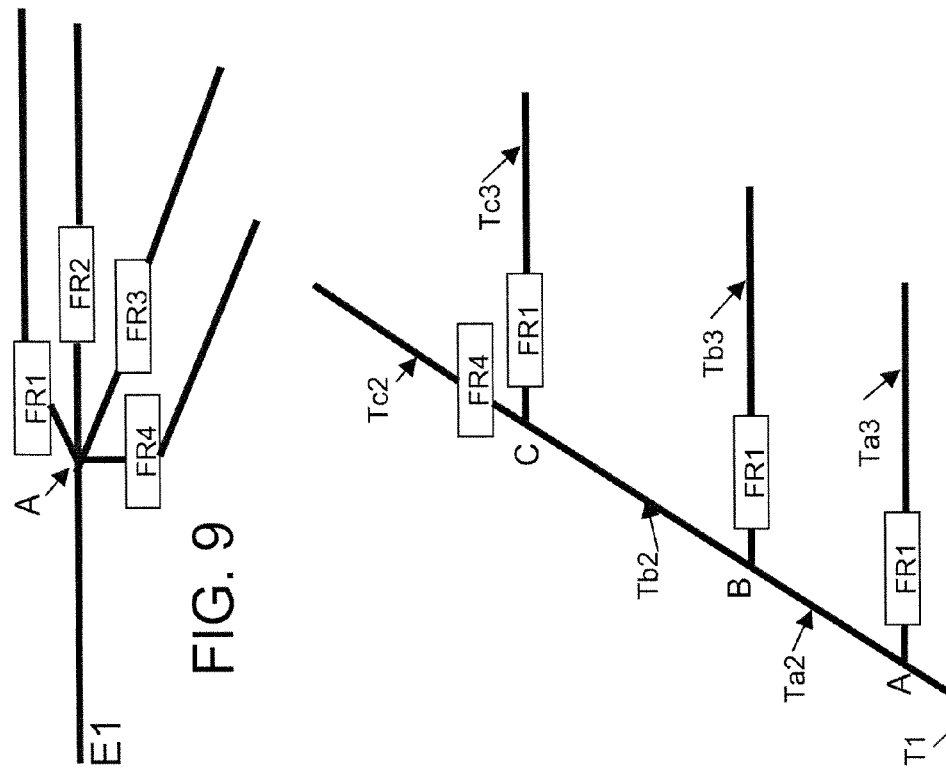
FIG. 9
FIG. 11

METHOD AND DEVICE FOR ANALYZING ELECTRIC CABLE NETWORKS

CROSS-REFERENCE TO RELATED APPLICATIONS

The present Application is based on International Application No. PCT/EP2007/056834, filed on Jul. 5, 2007, which in turn corresponds to French Application No. 0606531, filed on Jul. 18, 2006, and priority is hereby claimed under 35 USC §119 based on these applications. Each of these applications are hereby incorporated by reference in their entirety into the present application.

FIELD OF THE INVENTION

The invention relates to a method and a device for analyzing electric cables in a network, for the detection and location of defects in the cables of this network.

The electric cables concerned may be energy transmission cables or communication cables, in fixed installations (distribution network, indoor or outdoor communication network) or mobile installations (energy or communication network in an airplane, a boat, an automobile, etc.). The cables concerned may be any: coaxial or bifilar, in parallel lines or in twisted pairs, shielded or otherwise, etc., provided that the speed of propagation of the signals in these cables may be known. These networks may be organized according to various known topologies: bus, tree, meshed, ring, star, linear, or mixes of these various topologies.

The defects concerned are defects that may affect the electrical operation of the circuits of which the cables form part and may have consequences that can sometimes be very critical (electrical system faults in an airplane for example), or even defects that may lead directly to the starting of fires (short-circuits, electrical arcs in a dry environment or in the presence of humidity, etc.). It is important to be able to detect these defects so as to remedy them in time.

BACKGROUND OF THE INVENTION

It is understood that the problem of detecting defects is all the more important the longer and more complex the electric cable networks or the more difficult they are to access (buried cables for example). This is why remote detection and location systems have been contemplated, operating from one end of the cable. The procedures used are so-called reflectometry procedures, in which a signal injected at one end of a cable propagates in this cable and a part of the amplitude of the signal is reflected at the site of the defect, because of the impedance discontinuity that the signal encounters at this site. If the speed of propagation of the signals in the cable (related to its characteristic impedance) is known, the measurement of the duration which separates the emitted wave from the reflected wave gives an indication of the distance between the end of the cable and the defect.

In temporal reflectometry procedures (TDR for "Time-Domain Reflectometry"), an electromagnetic wave is injected into the cable in the form of a voltage pulse, a voltage step change, or other. The wave reflected at the site of the impedance discontinuity is detected at the site of the injection and the time gap between the emitted and received edges is measured. The position of the defect is determined on the basis of this gap, and the amplitude and the polarity of the reflected pulse give an indication of the type of defect (open circuit, short-circuit, resistive defect, or other).

There also exist frequency domain reflectometry procedures (FDR for "Frequency Domain Reflectometry"), which consist in injecting at the input of the cable a sinusoid which is frequency-wobulated continuously or by step changes and in measuring the frequency gap or phase gap between the emitted wave and the reflected wave. The published patent application WO 02/068968 describes a frequency domain reflectometry procedure. In a variant called SWR for "Standing Wave Reflectometry", the nodes and antinodes of a standing wave generated by the combining of an incident wave and its reflection are detected.

Frequency domain reflectometry procedures are effective for analyzing a simple cable. They are difficult to use when the cable comprises branch-offs. Time domain reflectometry procedures can be used even with branch-offs but the analysis of the reflected signals is difficult because of the presence of multiple reflections.

A procedure based on both time and frequency and consisting in injecting a linearly wobulated signal with a Gaussian amplitude envelope has also been proposed, in the published patent application WO 2004/005947.

Spread spectrum reflectometry procedures have also been proposed, in the article "Spread Spectrum Sensors for Critical Fault Location on Live Wire Networks" by Cynthia Furse et al., in Journal of Structural Control and Health Monitoring, Volume 12, Issue 3-4, 2005. A signal is transmitted in the form of a low-level pseudo-random code on a network, even when it is in service; this signal and its echo reflected by a possible defect are correlated with variable time offsets to establish a time-dependent correlation curve. This curve exhibits correlation spikes at time offsets related to the position of the defects and junctions and/or branch-offs of the network. This system is particularly suited to the detection of intermittent defects since it can operate even though the network is being used; however, intermittent defects may very well occur only when the network is in service and disappear when it no longer is (for example a defect which occurs while an airplane is flying but which disappears on the ground). This procedure can be used for cables comprising branch-offs, but it retains ambiguities: it is not possible to say on which branch a detected defect is situated.

Finally, a similar procedure but using quite simply the signals or the natural noise circulating in the cable, and not a pseudo-random code injected at the input of the cable, has been proposed in the article by Chet Lo and Cynthia Furse "Noise-Domain Reflectometry for Locating Wiring Faults" published in IEEE Transactions on Electromagnetic Compatibility, Vol 47 No 1 Febuary 2005. Spikes with strong correlation are detected in a process for correlating the signal with itself. This procedure suffers from the same defect as the previous one, that is to say it does not allow easy resolution of position ambiguities when there are several branches.

The aim of the invention is to resolve these ambiguities, notably in cables exhibiting a T-structure (also called a Y-structure), that is to say comprising at least one branch-off.

SUMMARY OF THE INVENTION

To achieve this, the invention proposes a method of testing a network of cables comprising at least one junction from which there depart N secondary stretches (N greater than or equal to 2), the method consisting in:
  interposing in the network, in series at the input of each of N−1 secondary stretches starting from the junction, a bidirectional passive filter able to cut off a frequency band associated with this stretch, the filters all allowing through the useful frequencies for the normal operation of the network, applying to the input of the network a pulsed test signal modulated simultaneously or successively by N−1 different carrier frequencies each situated in one of the N−1 frequency bands of the filters placed at the input of the stretches, the test signal also being modulated by an $N^{th}$ frequency situated outside the bands of the N−1 filters, detecting the temporal position of signal spikes arising from the reflection of the test signal, for each of the N frequencies, and deducing therefrom the position of possible defects on a stretch of cable of the network.

The amplitude of the modulation of the pulsed test signal applied to the input is preferably of Gaussian shape.

The frequency modulation by the N frequencies of the test signal is preferably simultaneous, the pulse containing the N carrier frequencies, but a solution in which several successive pulses are emitted, each modulated by a respective frequency, is also contemplated. The latter solution is however less advantageous since it generates several distinct response charts that must subsequently be reconciled.

The detection of position of defects is done preferably by way of a time-frequency analysis providing a time-frequency chart of the signals reflected towards the input of the cable; the temporal position of the spot centers of a series of reflection spots corresponding to different frequencies in the time-frequency chart then represents information about the position of a defect and the stretch in which it is situated.

With this method, it is possible to extract a non-ambiguous item of information about the position of a defect in a network cable having one or more branch-offs. A defect on a stretch is in fact located on the basis of a reflected signal which does not contain, at a given instant, the characteristic frequency related to this stretch; this defect can thus be distinguished from the defects present on another stretch and from the ends of these other stretches. The presence of the filters reduces the number of multiple reflections which tend, in the prior art, to make it difficult to utilize the reflectograms generated.

In practice, provision may be made
either for one of the secondary stretches linked to the junction not to comprise any filter and consequently for there to be in total N−1 filters associated with N−1 branch-offs and N frequencies applied to the input of the network,
or for all the secondary stretches to comprise a filter, in which case there are N filters associated with the N branch-offs and N frequencies applied to the input of the network.

According to the invention, there is also proposed a device for analyzing a network of electric cables comprising at least one junction from which there depart N secondary stretches (N greater than or equal to 2), the device comprising, in series at the input of each of N−1 secondary stretches starting from the junction, a bidirectional passive filter able to cut off a frequency band associated with this stretch, the filters all allowing through the useful frequencies for the normal operation of the network, a generator of short duration test signal simultaneously or successively modulated by N−1 different carrier frequencies each situated in one of the N−1 frequency bands of the filters placed at the input of the stretches, the test signal also being modulated by an $N^{th}$ frequency situated outside the rejection bands of the N−1 filters, and a device for detecting the temporal position of signal spikes arising from the reflection of the test signal, for each of the N frequencies.

The bidirectional passive filters allow the signal through while filtering it both in the outward direction of the emitted pulse and in the return direction of a reflected pulse. These are preferably reciprocal filters, having the same transfer function in both directions.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein:

FIG. 9 represents another configuration of cable network testable using the present invention (1 junction and 4 branch-offs);

FIG. 10 represents an example of filter templates usable in the testing of a network with several branches requiring four filters, such as for example the network of FIG. 9 or the network of FIG. 11;

FIG. 11 represents yet another configuration of a network of cables with junctions in series (3 junctions and 4 branch-offs).

DESCRIPTION OF PREFERRED EMBODIMENTS

Figure 1:
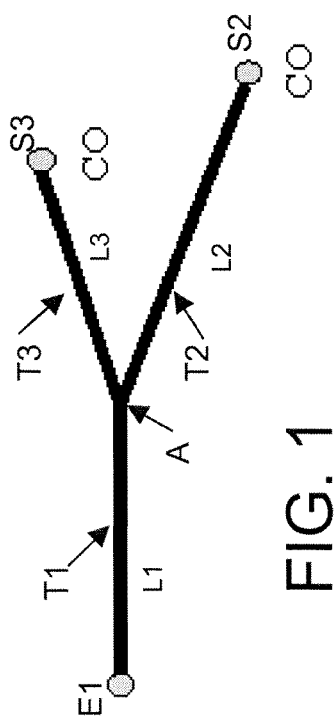
FIG. 1 represents a network of cables with branch-off that one wishes to analyze.

Schematically represented in FIG. 1 is a network with one junction and two branch-offs, having three stretches T1, T2 and T3. The stretches T2 and T3 have an input end linked to a junction point A situated at an output end of the stretch T1. Thus, if the network is followed starting from an input end E1 thereof, one successively encounters a cable length L1 of the stretch T1, then a junction at A, and, depending on whether one is following the stretch T2 or the stretch T3, respectively a cable length L2 of the stretch T2 up to its output end S2, or a cable length L3 of the stretch T3 up to its output end S3.

This is a simple example of a T-network (or Y-network). The stretches considered and represented by a line can consist of a sheathed conducting wire or a pair of sheathed wires or a coaxial cable. This network can serve either to transport energy or communication signals from the input E1 to the outputs S2 and S3, or in the opposite direction from one output S2 or S3 to the other or to the input E1. This is why the concepts of input and output are used here only for the reflectometry application and to fix the direction of emission of measurement signals that will be used for detecting defects: here by assumption the input E1 is that to which the network test signals are applied. The outputs of the stretches T2 and T3 can be open-circuited or short-circuited or matched to the impedance of the network (if they are matched they do not generate any reflection); in this example it has been assumed that the outputs S2 and S3 are open-circuited (CO), and this will make it possible to observe signals reflected at the ends so as to better elucidate the principles of the invention. These open circuits can also represent defects to be detected and located, for example unplugged connectors.

In the conventional procedures for detecting defects, a test pulse would typically be applied from the input E1, and a pattern of signals called a "reflectogram" would be gathered on this same input; the reflectogram is the plot of a curve representing the evolution of a voltage amplitude logged at the input E1 over time.

Figure 2:
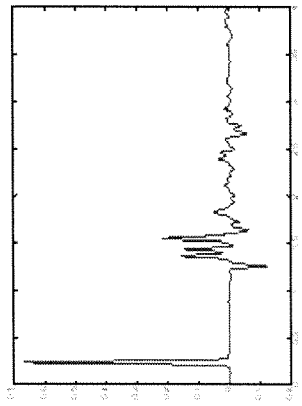
FIG. 2 represents a reflectogram generated by conventional test means applied to the network of FIG. 1.

FIG. 2 represents such a reflectogram for the cable of FIG. 1, with the time along the abscissa and a voltage amplitude along the ordinate. The test is done for a defect-free cable having a length of 10 meters for the first stretch L1, and lengths of 1 m80 and 1 m approximately for the stretches L2 and L3. The input pulse, to the left on the chart, is a positive pulse of short duration relative to the durations of propagation in the cables so that the reflected pulses do not mix with the emitted pulse. The reflected pulses are firstly a negative reflection pulse at the junction; the junction creates an impedance mismatch in which the impedance seen is lower than the characteristic impedance of the cable, hence the negative amplitude of the reflected signal. Then there is a positive pulse reflected by the open-circuited end (high impedance) of the stretch T2, and then a pulse which seems to arise from an outward-return journey between the junction A and the end S2 of the second stretch. Then a pulse occurs due to the reflection at the end S3 of the third stretch. Thereafter, the pulses arising from other multiple or combined reflections appear, for example a pulse resulting from the reflection, at the end of the stretch T2, of a pulse already reflected by the end of the third stretch. The first pulses are the most significant, the others are more difficult to utilize.

If a defect is present in one of the stretches, it may have the effect of displacing certain pulses or quite simply of adding pulses to the chart of FIG. 2. It is therefore not easy to interpret the existence of a defect and to find the location of the defect on the basis of such a reflectogram.

Figure 3:
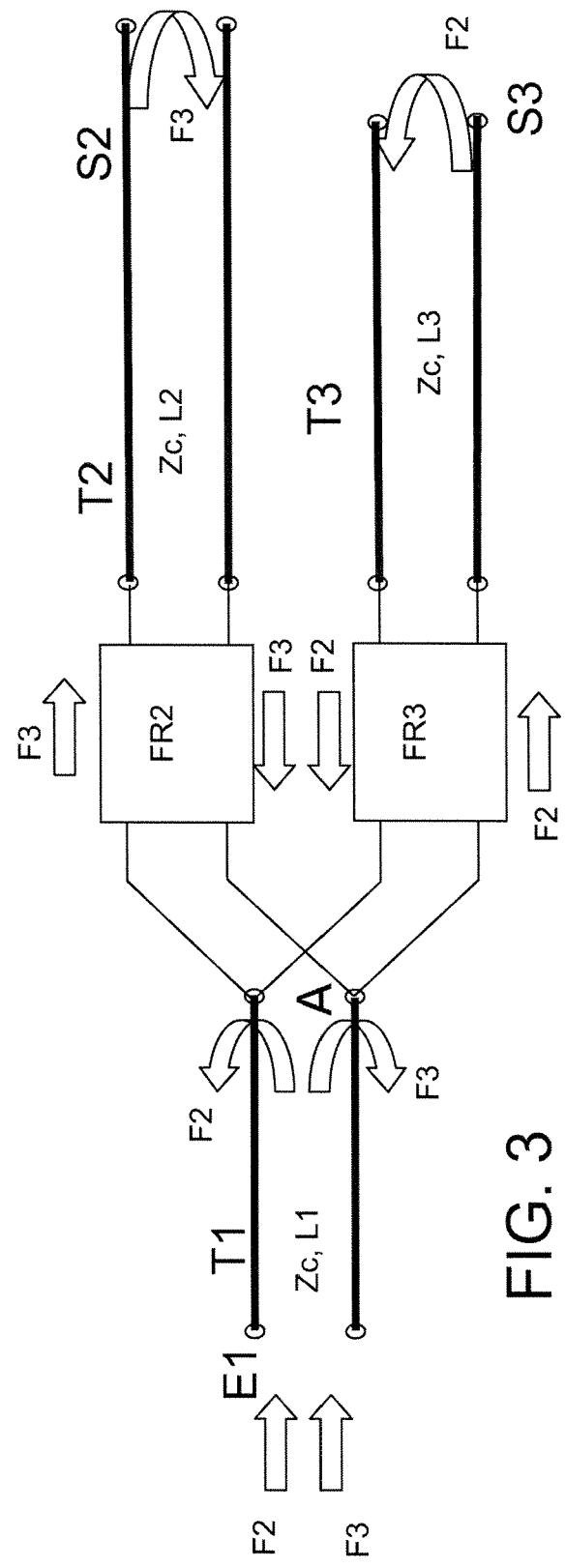
FIG. 3 represents the analysis device according to the invention.

FIG. 3 represents the principle of the device for analyzing defects according to the invention, applied to a T-cable of the same kind as that represented in FIG. 1; here the cable comprises two twisted or coaxial parallel wires and the two wires are represented by parallel lines. The parameters of the cable (characteristic impedance, propagation speed) are assumed to be identical for all the stretches; only the lengths differ. In the example represented in FIG. 3, the stretch T2 is larger than the stretch T3. The lengths can be respectively L1=10 meters approximately, L2=1.80 m approximately, L3=1 m approximately.

A test signal is applied to the input E1 in the form of a short duration pulse. Short duration is understood to mean short relative to the time taken by the pulse to propagate and reflect at the site of a defect situated at a distance where one wishes to be able to detect this defect. By way of example, if it is wished to detect a defect situated 1 meter from the input while the speed of propagation of the signals in a cable is of the order of 200 000 km/s, it will be understood that the pulse must have a duration which does not exceed a few tens of nanoseconds, so that the reflected pulse does not mix over time with the emitted pulse.

The pulse is frequency modulated and its overall amplitude is defined by an envelope of nonzero amplitude level for this short duration; this amplitude is modulated simultaneously by two carrier frequencies F2 and F3 situated amply above the frequency band of the signals that the cable is assumed to transmit during operation. For a low-frequency energy transport cable, this does not pose any problem. For a digital communications cable having to transmit for example 100 megabits per second, the frequencies F2 and F3 will have to be much greater than 100 megahertz. They can for example be 500 and 1000 MHz respectively. The constraints are as follows: the frequencies F2 and F3 must not be too high so that the pulses are not unduly attenuated in their propagation, the attenuation in the cables increasing for high frequencies. They must be sufficiently separated from one another so that it is possible to easily produce distinct rejector filters which reject one of the frequencies while allowing the other through.

The shape of the voltage envelope of the short duration test signal is preferably a Gaussian shape since it is this type of shape which makes it possible to have a signal spectrum that is most concentrated around the modulation frequencies F2 and F3; it is also this type of shape which allows the pulsed signal to undergo the least spectrum distortions during its propagation and its reflections. It would however be possible to use other envelope shapes for the test signal; overly square envelope shapes are however less advantageous because they exhibit a spectrum that is less concentrated around the modulation frequencies.

After the junction A, at the input of the stretch T2 is placed a rejector filter (bandstop filter) FR2 which strongly attenuates the frequencies in a band which contains the frequency F2 (for example a band centered on the frequency F2) but which hardly, if at all, attenuates the frequency F3 or the frequencies situated in the useful bandwidth of the signals which must be transported by the cable during operation.

Likewise, at the input of the stretch T3 is placed a rejector filter FR3 which strongly attenuates the frequencies in a band which contains the frequency F3 (for example a band centered on the frequency F3) but which hardly, if at all, attenuates the frequency F2 or the frequencies situated in the useful bandwidth of the signals which must be transported by the cable during operation.

The filter FR2 is in series in the stretch T2 and the filter FR3 is in series in the stretch T3. The filters are bidirectional so that they act equally well in respect of the signals traversing the stretch T2 or T3 from the input to the output and in respect of the signals traversing the stretch in the reverse direction. These are passive filters based on inductors and capacitors, optionally on resistors. Their attenuation is preferably as low as possible, especially in the useful frequency band of the signals which must be transported during normal operation. The filters are preferably reciprocal, that is to say their transfer function is preferably identical in both directions.

The pulse modulated by the frequencies F2 and F3 propagates in the stretch T1; it is partially reflected at the junction A on account of the impedance discontinuity exhibited at this site; it is partially transmitted by the stretch T2 except as regards the frequency band around F2 which is rejected by the filter FR2; the part which passes through (and notably the modulation at the frequency F3) is reflected at the end of the stretch T2. Conversely, the part not reflected at the junction A passes into the stretch T3 except as regards the frequency band around F3 which is rejected by the filter FR3; the modulation at the frequency F2 passes through and is reflected at the end of the stretch T3.

Figure 4:
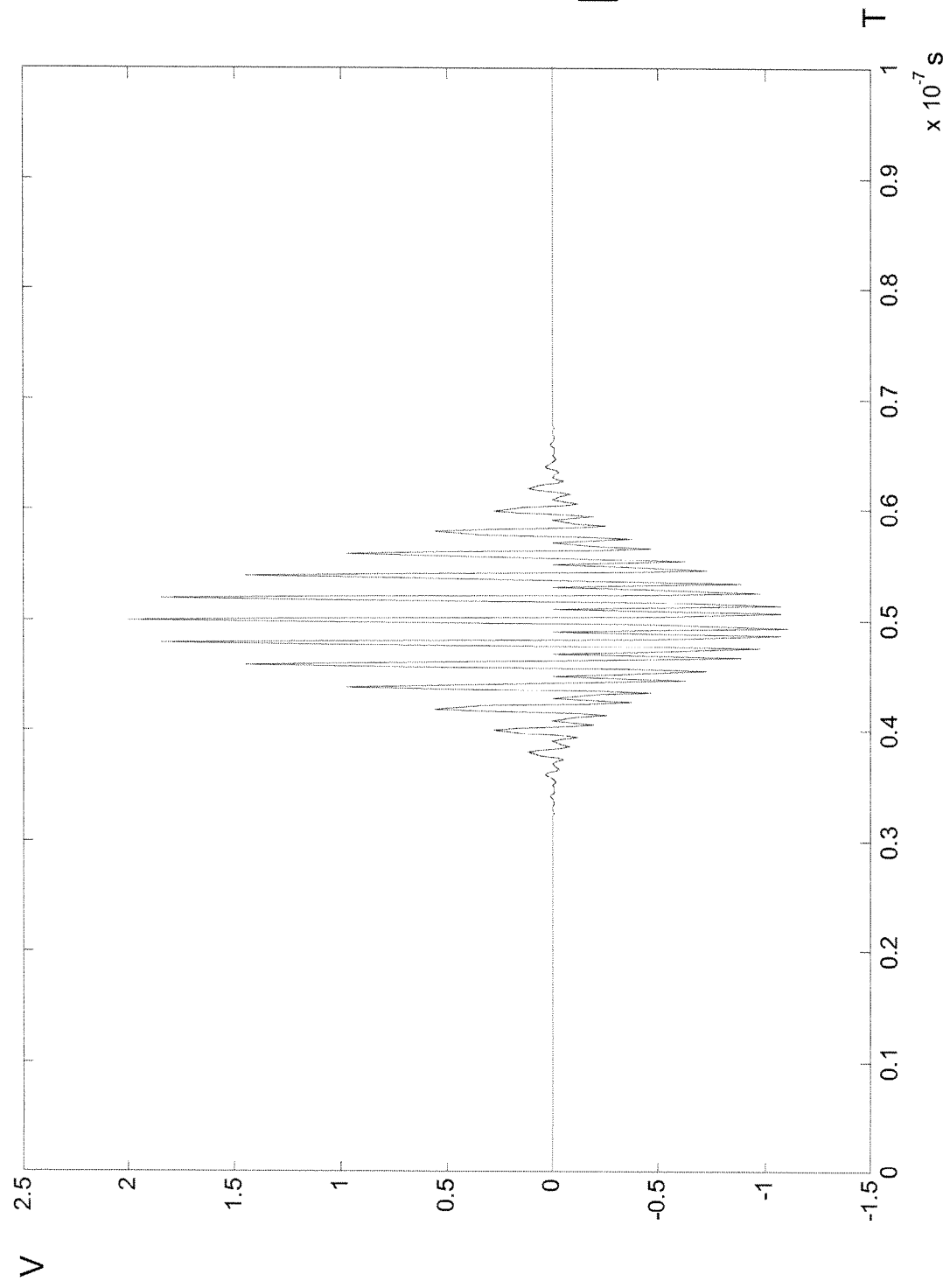
FIG. 4 represents a preferred waveform for the pulsed test signal applied to the input.

FIG. 4 represents the preferred waveform (Gaussian frequency modulated by the frequencies F2 and F3) of the test pulse emitted; the time T is along the abscissa, in seconds; the instantaneous amplitude V is along the ordinate, in arbitrary units. The duration of the pulse in this example is about 30 nanoseconds (width at mid-height of the Gaussian: about 12 nanoseconds). The modulation is distinguished by two superimposed frequencies, one of which is, in this example, double the other (typically 500 and 1000 MHz); the Gaussian envelope of the amplitude of the signal is also distinguished. This pulse is applied to the input E1 (FIG. 3) by a test signal generator, not represented.

Figure 5:
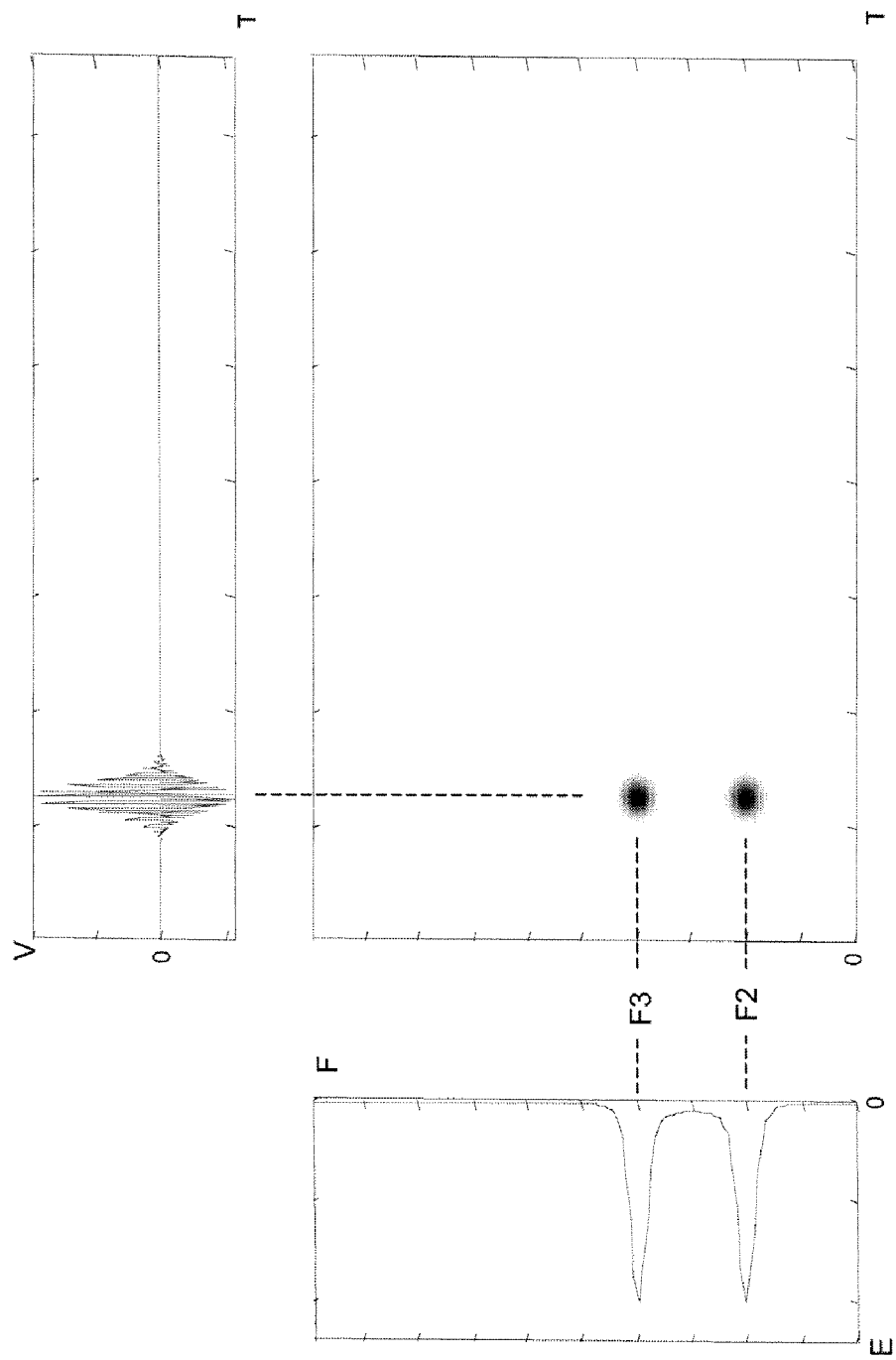
FIG. 5 represents a chart which is the result of a time-frequency analysis of the emitted pulse.

FIG. 5 represents the same test signal, but according to another representation comprising three associated charts; the charts represent the emitted pulse, respectively in a time domain (upper rectangle of FIG. 5), in a spectral domain (left rectangle of the figure) and in a time-frequency domain (the largest rectangle between the upper rectangle and the left rectangle).

The representation in the time domain is merely a reduction of the representation of FIG. 4: time T along the rightward horizontal abscissa, voltage amplitude V along the upward vertical ordinate.

The representation in the spectral domain (frequency F along the upward vertical abscissa, energy density E along the leftward horizontal ordinate) shows two spikes centered around the pulse modulation frequencies F2 and F3.

The representation in the time-frequency domain (time T along the rightward horizontal abscissa, frequency F along the upward vertical ordinate) shows two concentrated spots corresponding to two narrow spectra, one centered on the frequency F2, the other on the frequency F3; the centers of the spots have as abscissa the instant corresponding to the top of the spike of the Gaussian envelope of the pulse and as ordinates the frequencies F2 and F3 respectively.

To terminate this description of the test signal, it may be indicated that the instantaneous amplitude of the pulse is of the form $$S(t)=S0 e^{-(1/2)[(t/a)powr2]} \cdot [\cos(2\pi \cdot F2 \cdot t)+\cos(2\pi \cdot F3 \cdot t)]$$

S(t) is the amplitude as a function of time t; S0 is an amplitude of the top of the Gaussian envelope; a is a coefficient which determines the width of the Gaussian pulse at mid-height, that is to say the greater or lesser spreading of the pulse; this width at mid-height is equal to 2 a·(2 log 2)$^{(1/2)}$; (t/a)powr2 represents the ratio t/a squared $(t/a)^2$.

Typically, for a pulse of the order of 30 nanoseconds, the variable a can be chosen equal to about $5 \cdot 10^{-9}$, t being expressed in seconds.

The time-frequency chart is plotted with the aid of a time-frequency analyzer connected to the input E1 of the network by a T-junction. Such analyzers are known, they operate by sampling and digitizing the signals that they receive, and calculation on the samples, notably Fourier transform calculations making it possible to determine the frequency components contained in a signal of short duration. It is also possible to use time-frequency numerical algorithms to perform this analysis.

The same time-frequency analyzer connected to the input E1 also makes it possible to plot a time-frequency chart of the signals reflected towards the input E1.

Figure 6:
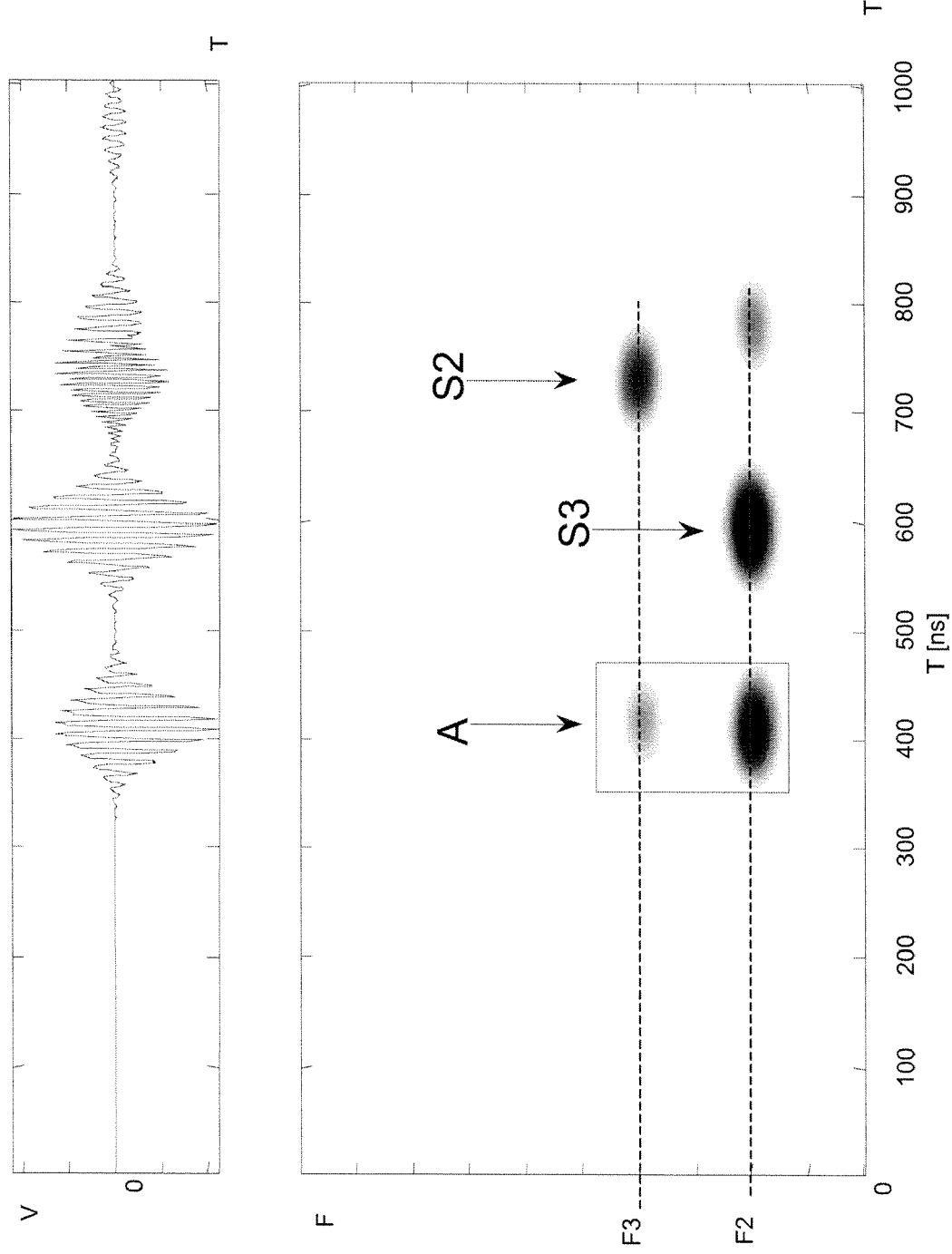
FIG. 6 represents a time-frequency chart of the signals reflected by the cable in the configuration of FIG. 3.

FIG. 6 represents, with a dual representation, amplitude time on the one hand and time-frequency on the other hand, a reflectogram resulting from the application of a voltage pulse of Gaussian amplitude, modulated by the frequencies F2 and F3 in a cable equipped according to the invention with rejector filters FR2 and FR3; the setup complies with the diagram of FIG. 3; the cable lengths are as follows: about 3 meters for L1, 3 m for L3, 6 m for L2. The pulse emitted is not represented on this reflectogram because of the scales used both for the amplitude V and for the time T; only the reflections are represented. The time origin is arbitrary in this drawing.

The time/frequency reflectogram (at the bottom of the figure), more explicit than the amplitude/time reflectogram (at the top), reveals several spots centered on a respective time and a respective frequency. The leftmost spots, centered respectively on the frequencies F2 and F3, correspond to the reflection of the Gaussian pulse on the junction A. There is a spot for each frequency and the durations of propagation for the two frequencies are identical, so that the spots are centered on the same instant which is the spike of a Gaussian signal modulated by the two frequencies. The next spot towards the right is centered on the frequency F2; it does not originate from a reflection in the stretch T2 which does not permit the passage of this frequency; it corresponds to the reflection at the end S3 of the stretch T3 (which is the shortest). The next spot towards the right is centered on the frequency F3; it cannot correspond to a reflection in the stretch T3 which does not allow this frequency through; it corresponds to a reflection at the end S2 of the other stretch T2. The last spot on the right corresponds, since it is centered on the frequency F2, to a multiple reflection in the stretch T3 (two outward-return trips between the junction A and the end S3).

In the event of a defect in the stretch T1, a double spot (one centered on F2 and the other on F3) may appear between the position of the spot representing the input pulse (not visible in FIG. 6) and the spot representing the junction A. The temporal position of this spot makes it possible to deduce the physical position of the defect, knowing the speed of propagation of the signals in the cable. The sign of the amplitudes makes it possible to ascertain whether the defect is of open-circuit type (signal of the same sign as the emitted pulse) or of short-circuit type (negative signal). In the event of a defect in the stretch T2, a spot at the frequency F3 appears between the spot corresponding to the junction A and that which corresponds to the known theoretical length L2 of the stretch. Finally, in the event of a defect in the stretch T3, a spot at the frequency F2 appears between the position of the junction A and the position of the output S3 of the stretch T3. The presence of the rejector filters makes it possible to unambiguously ascertain on which stretch the defect is situated, if the basic topology of the network in the absence of any defect is known.

It will be understood that for better detection and analysis of defects, it is preferable to know the theoretical lengths of the cable stretches, thereby making it possible to identify with certainty the reflection spots which correspond to normal ends of the stretches so as to distinguish them from spots corresponding to defects. If the ends S2 and S3 of the cables are loaded by impedances matched to the characteristic impedance of the cable there is no reflection (except at the junction) and only the defects generate reflections which are henceforth very easy to identify in terms of nature and position.

The time-frequency representation that may be given by an apparatus for analyzing frequencies therefore provides a very convenient representation of the possible defects of the cable. By reading at one and the same time the instant of arrival of a spot arising from a reflection of the test signal and the frequency corresponding to this spot, and by taking account of the propagation speed in the cable, it is possible to determine the position of a defect along the cable while distinguishing the various stretches.

Figure 7:
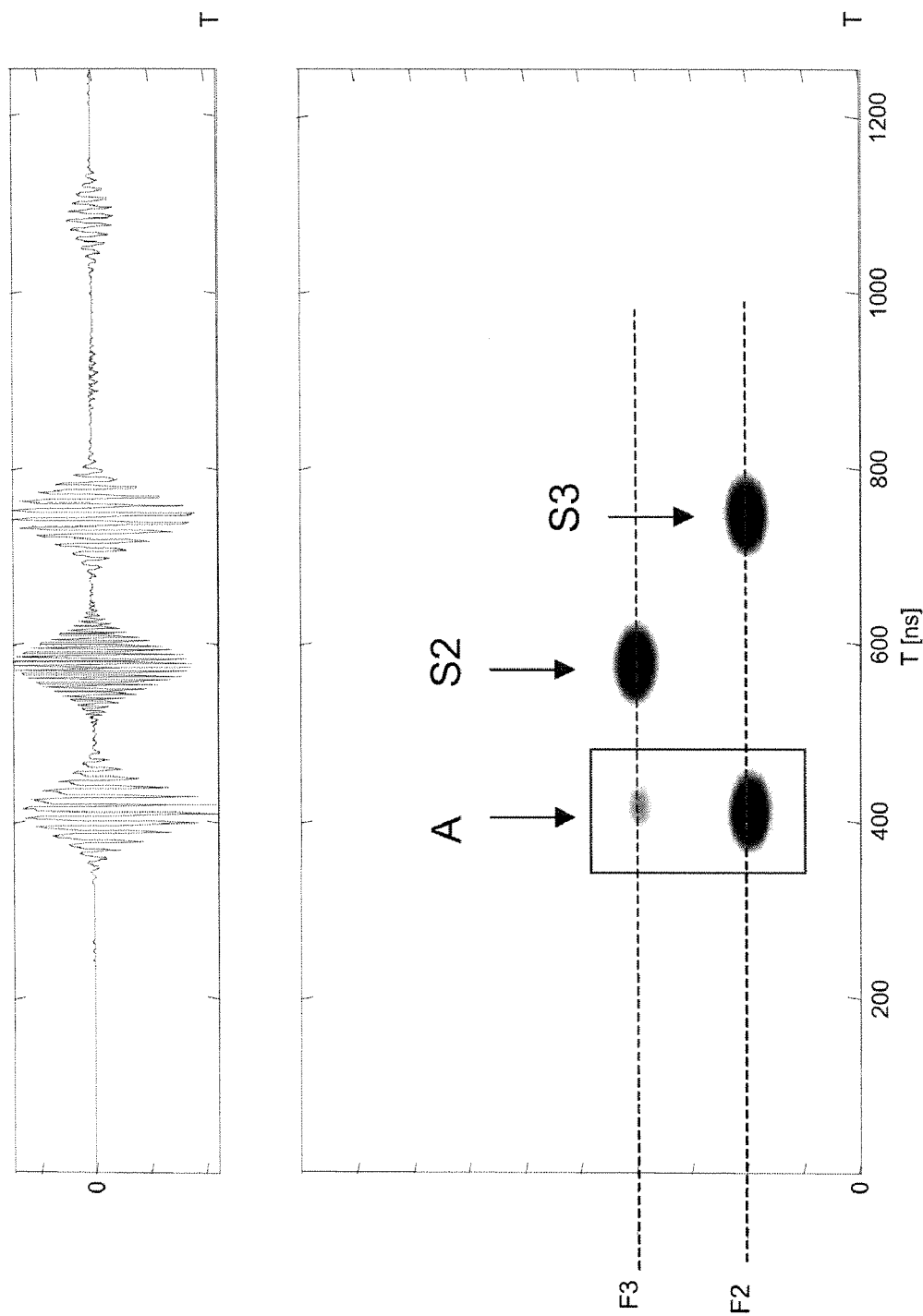
FIG. 7 represents a similar chart in the case where the stretch T3 of the cable is longer than the stretch T2.
Figure 8:
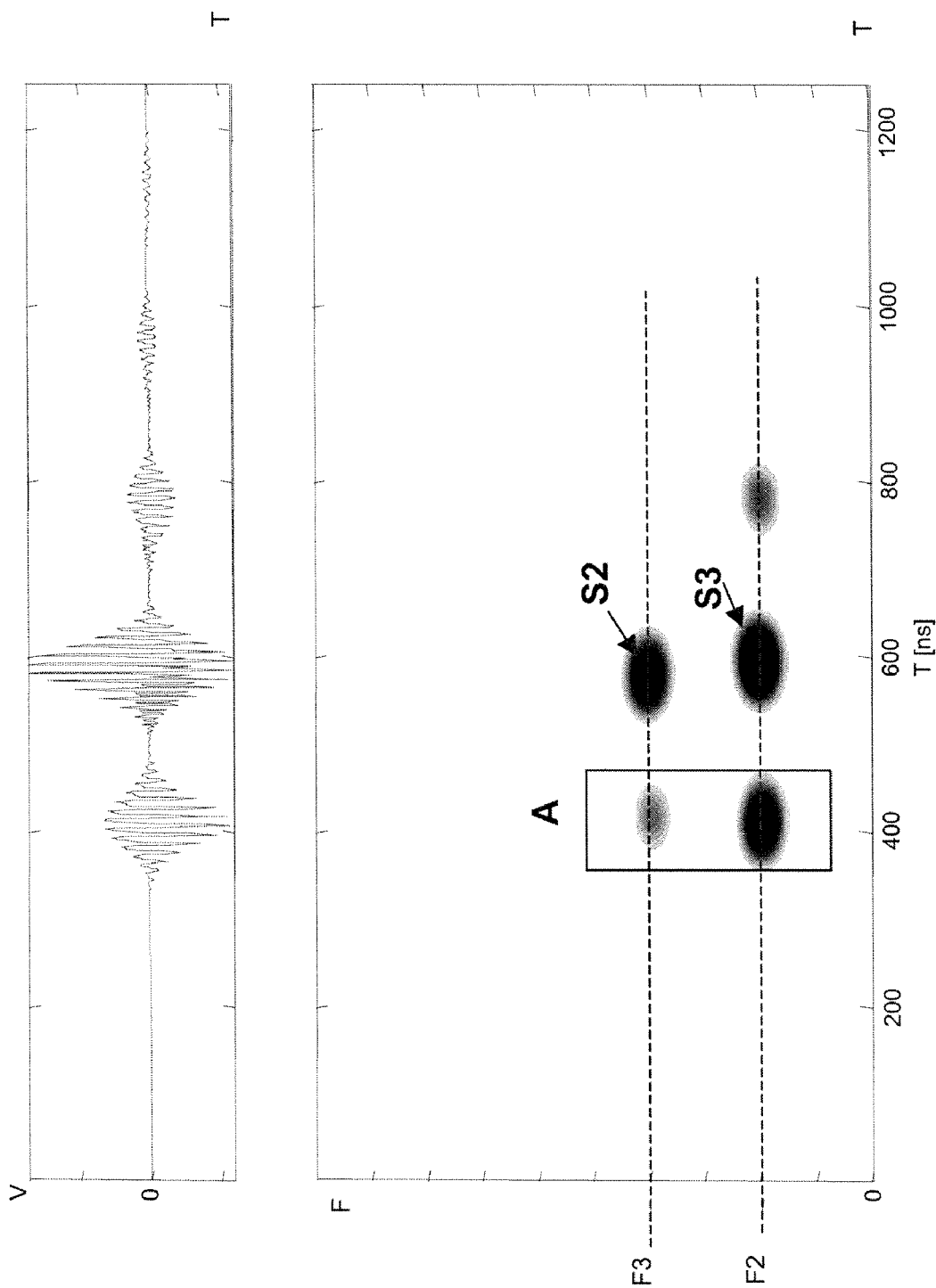
FIG. 8 represents a chart in the case where the stretches are identical.

FIG. 7 represents another reflectogram which would be obtained if the stretch T3 were longer than the stretch T2, and FIG. 8 a reflectogram corresponding to stretches of the same length.

Generally, it is understood that a defect situated a given distance from the input gives rise to a different reflectogram depending on whether it is situated on the second or the third stretch.

In the foregoing, it was considered that if the cable possesses two stretches after the junction A, then two rejector filters FR2 and FR3 centered around the modulation frequencies F2 and F3 are used. Nevertheless, it is possible to envisage the use of a single filter, for example a filter FR2 at the input of the stretch T2 but no filter FR3 at the input of the stretch T3. Even in this case, it is still possible to discriminate the defects on the two stretches: a reflection on the stretch T3 will correspond to two spots centered on the same instant and corresponding to the two frequencies F2 and F3, while a reflection in the stretch T2 will generate only one spot at the frequency F3.

The invention can be used when there are more than two stretches at the output of the junction. If there are N stretches linked to the junction, N rejector filters will be used (one at the input of each stretch) or else N−1 rejector filters only (one at the input of each stretch except for the $N^{th}$ stretch). Consequently, in general the method will use at least N−1 rejector filters and possibly an $N^{th}$ rejector filter.

Assuming that there is a short-circuit or open-circuit defect at a given position of one of the stretches, a series of N reflection spots in the time-frequency domain will be seen to appear at an instant which corresponds to the signal outward-return trip from the input up to the defect if the defect occurs before the junction (or after the junction but on a stretch with no rejector filter). But if the defect exists, at this distance, on a $j^{th}$ stretch provided with a rejector filter for a frequency Fj, there will be no spot at the frequency Fj in the series of spots that are centered on the instant considered and it is this lack in a series of spots that are centered on one and the same instant which will make it possible to determine that the defect corresponding to this instant is indeed situated on the $j^{th}$ stretch.

FIG. 9 represents a configuration with 4 stretches which start from one and the same junction A, therefore requiring four test frequencies F1, F2, F3, F4. There are four rejector filters FR1, FR2, FR3, FR4 corresponding to these four stretches; one of these filters could be removed as explained in regard to a junction with two branch-offs.

FIG. 10 represents the template, shown diagrammatically, of each of the four filters: the filter FR1 rejects a frequency band centered on F1, the filter FR2 rejects a band centered on F2, the filter FR3 rejects a band centered on F3. The filter corresponding to the highest test frequency, that is to say the filter FR4 in this case, corresponding to the frequency F4, can be a low-pass filter rather than a bandstop filter, cutting off the frequency F4 and the higher frequencies and allowing through the frequencies F1, F2 and F3. If there is no filter FR4 in this structure with four stretches, it is the filter FR3 which may be a low-pass filter, allowing through the frequencies F1 and F2 and cutting off the frequency F3.

The useful frequency band during operation, represented by a frequency Fu in the diagram of FIG. 10, is by assumption lower than all the frequencies used in modulating the test signal; it is not attenuated by any of the filters since it is lower than all the frequency bands cut off by the filters.

FIG. 11 illustrates another configuration of a network of cables, with several successive junctions A, B, C each with two branch-offs, in total 3 junctions and four branch-offs:

Ta2, Ta3 for junction A,
Tb2, Tb3 for junction B situated at the end of the stretch Ta2,
Tc2, Tc3 for junction C situated at the end of the stretch Tb2.

This configuration can be tested by the same procedure, and requires four test frequencies F1 to F4 and four filters (or strictly speaking just three) whose templates comply with the same requirements as previously. The number of frequencies necessary for the test is deduced from the configuration, by arranging for there not to be two bandstop filters in series. The first two junctions may each be followed by only one filter, the last junction can comprise one or two filters.

In the foregoing, it has been considered that the test pulse was a single pulse modulated simultaneously by several carrier frequencies. As indicated above, the Gaussian test pulse generator also could provide several successive pulses, each modulated by a respective frequency. Several reflectograms are then produced and they must be superimposed to deduce therefrom the presence, the position and the nature of the defect. This solution is less advantageous.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method of testing a network of electric cables comprising at least one junction from which there depart N secondary cable stretches (N greater than or equal to 2), wherein the method comprises:
   interposing in the network, in series at the input of each of N−1 secondary stretches starting from the junction, a bidirectional passive filter able to cut off a frequency band associated with said stretch, the filters allowing through all frequencies that are useful for the normal operation of the network,
   applying to the input of the network a pulsed test signal modulated simultaneously or successively by N−1 different carrier frequencies each situated in one of the N−1 frequency bands of the filters placed at the input of the stretches, the test signal also being modulated by an $N^{th}$ frequency situated outside the bands of the N−1 filters,
   detecting the temporal position of signal spikes arising from the reflection of the test signal, for each of the N frequencies,
   and deducing therefrom the position of possible defects on a stretch of cable of the network.

2. The method as claimed in claim 1, wherein an $N^{th}$ rejector filter, rejecting the frequencies around the $N^{th}$ frequency, is placed at the input of the $N^{th}$ stretch.

3. The method as claimed in claim 2, wherein the test signal is amplitude modulated by a Gaussian wavefrom.

4. The method as claimed in claim 3, wherein at least one of the bidirectional filters is a reciprocal filter.

5. The method as claimed in claim 4, wherein the detection of position of defects is done by way of a time-frequency analysis providing a time-frequency chart of the signals reflected towards the input of the network, the temporal position of the centers of a series of reflection spots corresponding to different frequencies in the time-frequency chart representing an item of information about the position of a defect and the stretch in which it is situated.

6. The method as claimed in claim 3, wherein the detection of position of defects is done by way of a time-frequency analysis providing a time-frequency chart of the signals reflected towards the input of the network, the temporal position of the centers of a series of reflection spots corresponding to different frequencies in the time-frequency chart representing an item of information about the position of a defect and the stretch in which it is situated.

7. The method as claimed in claim 2, wherein at least one of the bidirectional filters is a reciprocal filter.

8. The method as claimed in claim 2, wherein the detection of position of defects is done by way of a time-frequency analysis providing a time-frequency chart of the signals reflected towards the input of the network, the temporal position of the centers of a series of reflection spots corresponding to different frequencies in the time-frequency chart representing an item of information about the position of a defect and the stretch in which it is situated.

9. The method as claimed in claim 1, wherein the test signal is amplitude modulated by a Gaussian waveform.

10. The method as claimed in claim 9, wherein at least one of the bidirectional filters is a reciprocal filter.

11. The method as claimed in claim 9, wherein the detection of position of defects is done by way of a time-frequency analysis providing a time-frequency chart of the signals reflected towards the input of the network, the temporal position of the centers of a series of reflection spots corresponding to different frequencies in the time-frequency chart representing an item of information about the position of a defect and the stretch in which it is situated.

12. The method as claimed in claim 1, wherein at least one of the bidirectional filters is a reciprocal filter.

13. The method as claimed in claim 1, wherein the detection of position of defects is done by way of a time-frequency analysis providing a time-frequency chart of the signals reflected towards the input of the network, the temporal position of the centers of a series of reflection spots corresponding to different frequencies in the time-frequency chart representing an item of information about the position of a defect and the stretch in which it is situated.

14. A device for analyzing a network of electric cables comprising at least one junction from which there depart N secondary cable stretches (N greater than or equal to 2), comprising, in series at the input of each of N−1 secondary stretches starting from the junction, a bidirectional passive filter able to cut off a respective frequency band associated with this stretch, the filters allowing through all frequencies that are useful for the normal operation of the network, a generator of short duration test signal modulated simultaneously or successively by N−1 different carrier frequencies each situated in one of the N−1 frequency bands of the filters placed at the input of the stretches, the signal also being modulated by an $N^{th}$ frequency situated outside the bands of the N−1 filters, and a device for detecting the temporal position of signal spikes arising from the reflection of the test signal, for each of the N frequencies.

15. The device as claimed in claim 14, comprising a time-frequency analyzer able to provide a time-frequency chart for analyzing the signals reflected towards the input of the network, the temporal position of the center of a series of reflection spots corresponding to different frequencies in the time-frequency chart representing an item of information about the position of a defect and the stretch in which it is situated.

16. The device as claimed in claim 15, wherein at least one of the bidirectional filters is a reciprocal filter.

17. The device as claimed in claim 14, wherein at least one of the bidirectional filters is a reciprocal filter.

* * * * *